United States Patent [19]

Weber

[11] 4,306,223
[45] Dec. 15, 1981

[54] DATA HANDLING SYSTEM USING A SEQUENTIAL APPROXIMATION ENCODING AND DECODING TECHNIQUE

[75] Inventor: Donald R. Weber, Saratoga, Calif.

[73] Assignee: Rapicom, Inc., Santa Clara, Calif.

[21] Appl. No.: 174,712

[22] Filed: Aug. 1, 1980

Related U.S. Application Data

[60] Continuation of Ser. No. 914,626, Jun. 12, 1978, abandoned, which is a division of Ser. No. 635,604, Dec. 31, 1975, which is a continuation of Ser. No. 342,854, Mar. 19, 1973, abandoned, which is a continuation of Ser. No. 66,459, Aug. 24, 1970, abandoned.

[51] Int. Cl.³ .......................................... H03K 13/02
[52] U.S. Cl. ............................................. 340/347 DA
[58] Field of Search ................. 340/347 DA, 347 M; 332/11 D; 375/28-33

[56] References Cited

U.S. PATENT DOCUMENTS 3,273,142  9/1966  Zukin ................... 340/347 DA
3,278,930 10/1966  Boutmy ................ 340/347 DA Primary Examiner—Charles D. Miller
Attorney, Agent, or Firm—Harvey G. Lowhurst

[57] ABSTRACT

A data handling system for converting an analog signal into binary form for storage or transmission to a remote receiver and subsequent reconstruction back into a facsimile of the original analog signal. The encoder portion of the system, which is a synthetic equivalent of an adaptive inverse filter, includes a signal comparator, an adaptive function generator and a binary pulse generating means. The signal comparator provides a signal responsive to the difference between the input analog signal and the output of the function generator, and the pulse generating means converts the difference signal into the encoded binary form for storage or transmission to a receiver. The decoder portion of the system includes an adaptive RC filter means which is controlled by the encoded data so as to reconstruct the original analog signal.

5 Claims, 11 Drawing Figures

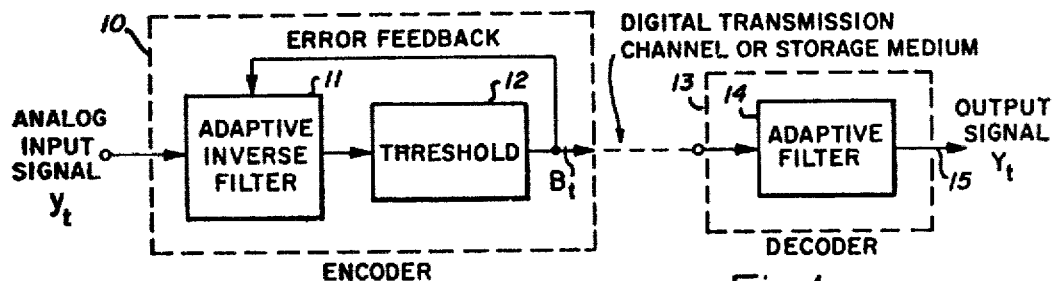
Fig_1
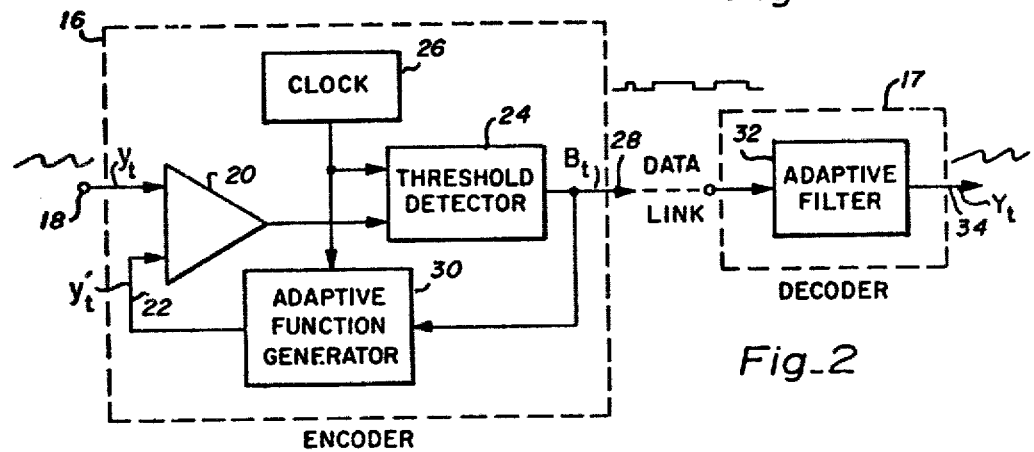
Fig_2
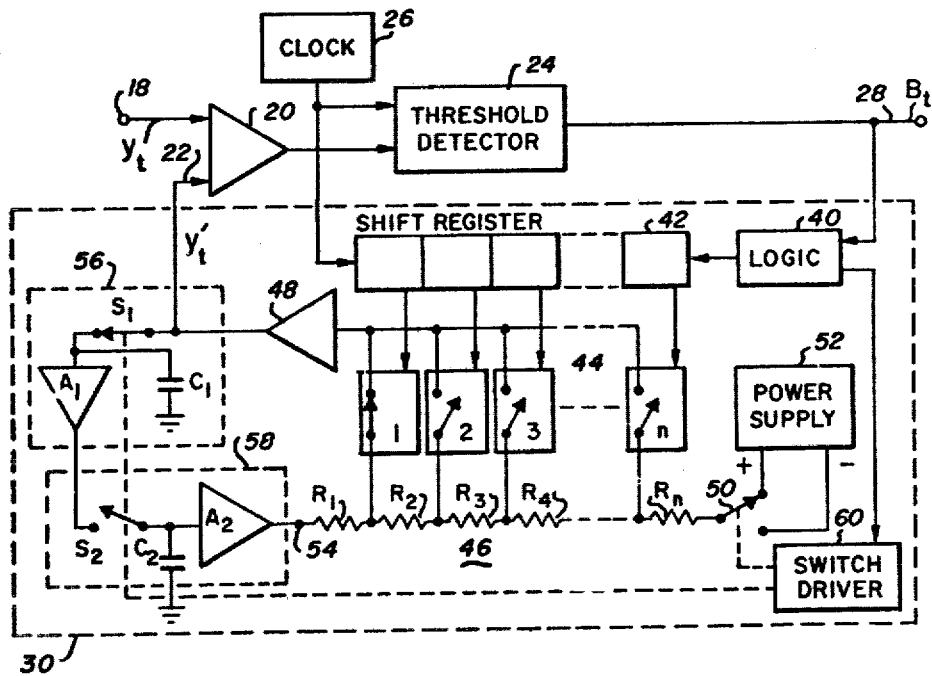
Fig_3

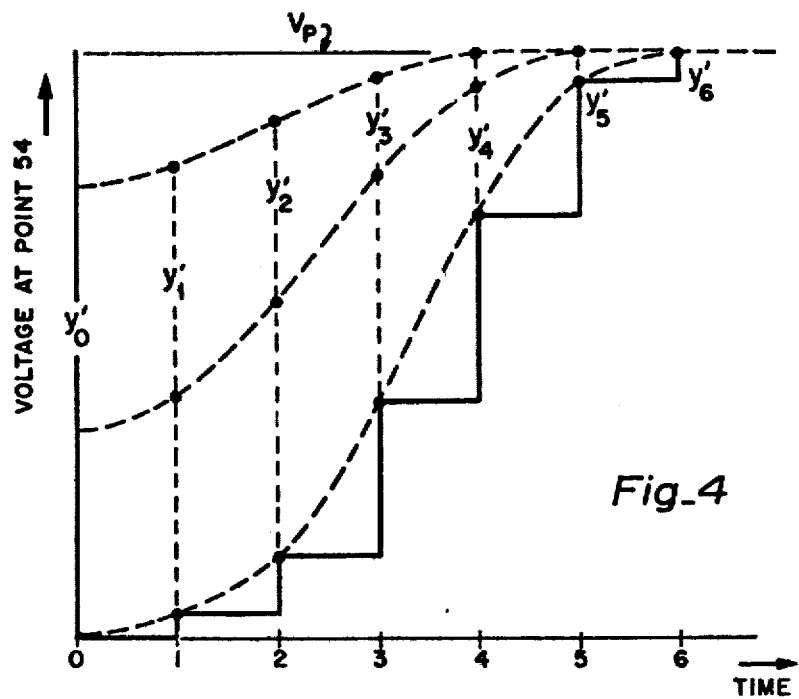
Fig_4
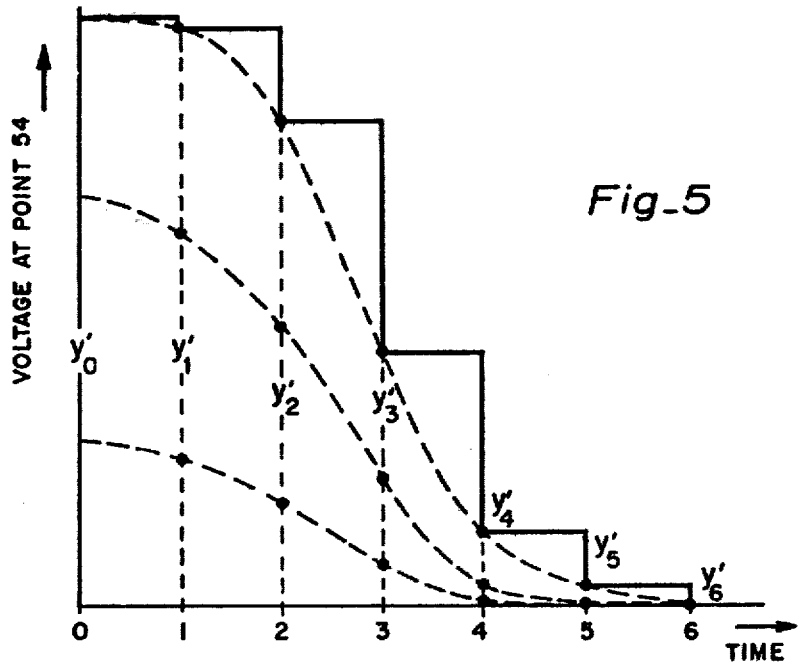
Fig_5

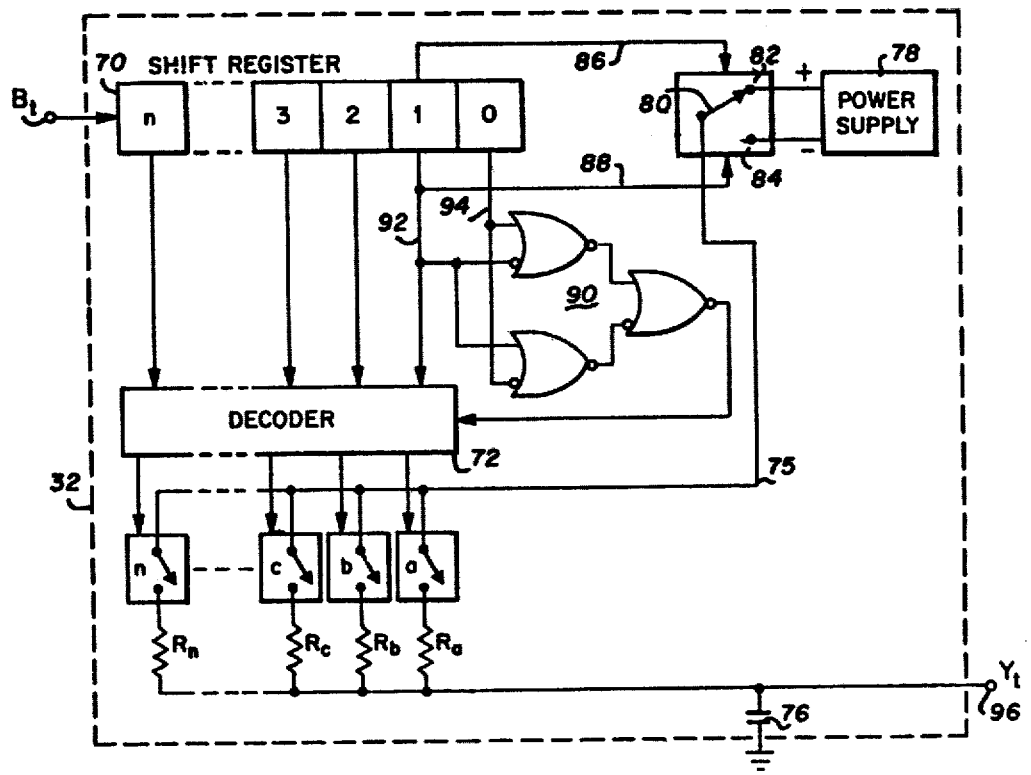
Fig_6
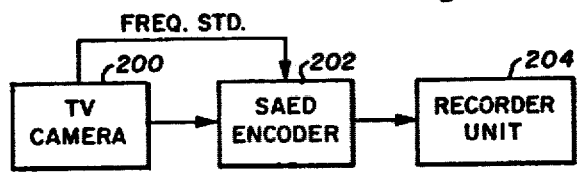
Fig_10
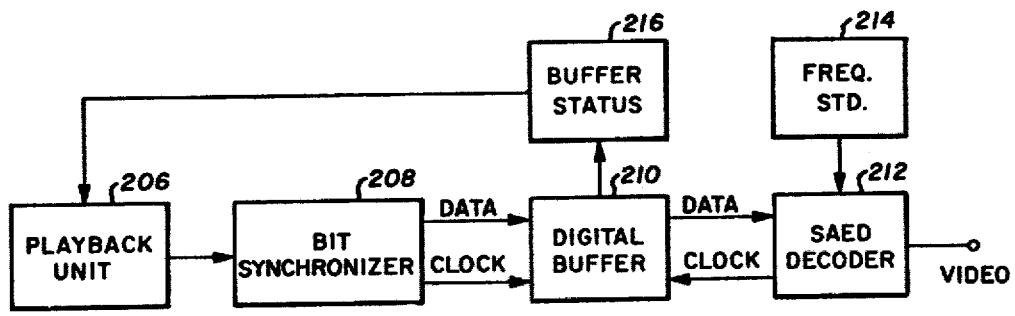
Fig_11

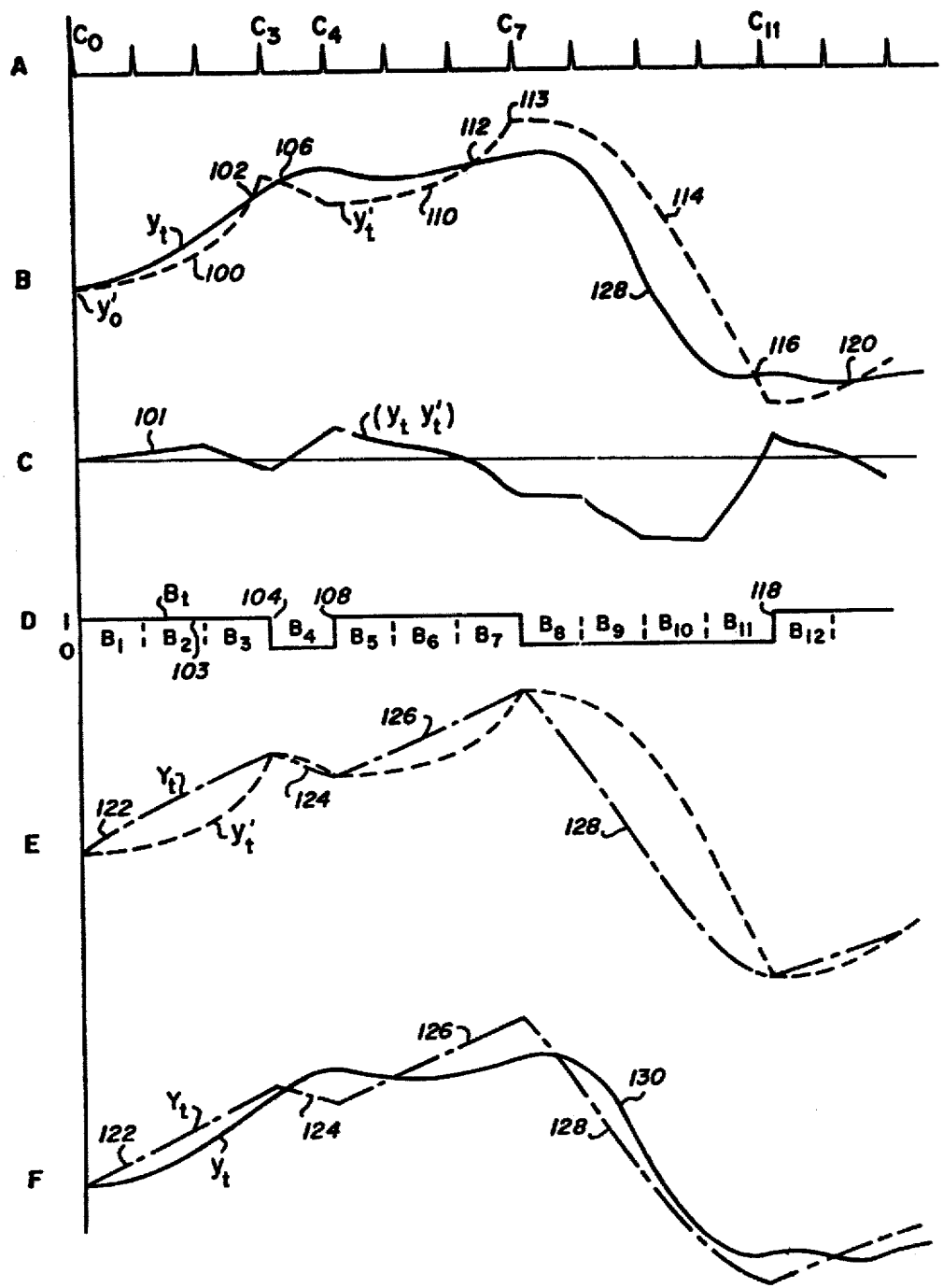
Fig_9

DATA HANDLING SYSTEM USING A SEQUENTIAL APPROXIMATION ENCODING AND DECODING TECHNIQUE

This application is a continuation of application Ser. No. 914,626, filed June 12, 1978, now abandoned, which in turn is a division of Ser. No. 635,604 filed Dec. 31, 1975, which in turn is a continuation of Ser. No. 342,854 filed Mar. 19, 1973, now abandoned, which in turn is a continuation of Ser. No. 66,459 filed Aug. 24, 1970, now abandoned.

BACKGROUND OF THE INVENTION

The present invention is generally related to data handling systems and more particularly to a novel sequential approximation encoding and decoding (SAED) system for transforming analog data into binary signals suitable for storage or transmission and for subsequently reconstructing the original analog data from the binary signals.

Recent progress in data processing technology has created a demand for systems capable of converting high frequency analog data into a digital form more suitable for storage or transmission to a remote receiver utilizing state-of-the-art storage and transmission media. Where commercial TV or radar information is stored using state-of-the-art recording systems, the recorded data must ordinarily be played back using the same equipment used to record it in order that the recorded output have an acceptable degree of time-base stability and tape alignment. However, if the analog information is first converted to digital form prior to being recorded, then buffer devices can be used to electronically correct the time-base instability of the played back signal. Thus, a recording made on one machine can be played back on another machine without unacceptable distortion.

Similarly, in the data transmission arts where large quantities of continuous tone picture imagery or other analog data must be transmitted between remote locations, the continually expanding volume of data to be transmitted has led to further saturation of the already overcrowded electromagnetic spectrum, and now severely taxes systems using present multiplexing techniques.

Most modern analog data transmission systems for transmitting radar video, television signals or scanned photographs are inefficient in the sense that the average source information rate is substantially less than the link channel capacity. The resulting waste can be attributed to at least the following factors:

(1) Where DC response is required, a portion of the transmitter bandwidth must be allocated to insure the effectiveness of the modulation technique utilized.

(2) Where data is obtained from multiple sources, bandwidth in excess of that required to transmit the desired base-band video must be set aside for each source in order to provide adequate guard bands for channel isolation (as in the case of frequency division multiplexing). If time division multiplexing is used, 50% to 80% additional bandwidth must be provided for oversampling to minimize aliasing errors. In addition, presampling filtering must be used which further deducts from the usable video bandwidth.

(3) Where data is obtained from a video source, low communication efficiency stems from the time variant frequency spectral behavior of the source. Since a properly designed communication system must be able to accommodate the highest frequency components anticipated from a given source the system will operate at low efficiency whenever the channel capacity is not completely utilized. A radar base-band video is typical of the time-dependent video signal source.

During the past several years, considerable progress has been made in minimizing the communication inefficiency resulting from these varying signal characteristics through the use of various data compression techniques. Until recently, the most promising compression methods for video bandwidth reduction were the delta modulation (DM) and redundancy reduction (RR) techniques. There have, for example, been more than 100 DM techniques proposed or devised, and several are currently in operational use. For example, see U.S. Pat. Nos. 2,724,740, 2,897,275 and 3,339,142, and the publication by R. M. Wilkinson entitled Delta Modulation for Analog to Digital Conversion of Speech Signals, SRDE Report No. 69022.

In delta modulation, positive or negative binary pulses (marks or spaces) are transmitted at a constant clock rate. The synthesized output wave typically changes one level per clock pulse corresponding to the polarity of the transmitted pulse. The transmitted pulse is positive if the synthesized demodulated output is more negative than the input, and the pulse is negative if the output is more positive than the input. Although delta modulation is simple in terms of circuit complexity, this technique is extremely vulnerable to transmission bit errors and, because it is constrained to change in a fixed step-wise fashion, it typically exhibits poor transient response.

High information delta modulation (HIDM) which is a variation of conventional delta modulation and which has been used for voice transmission can also be used to pulse encode pictorial data. It is able to do this with some degree of efficiency, and requires only two pulses per picture element to provide a subjective quality comparable to fixed bit pulse code modulations. HIDM differs from ordinary delta modulation essentially in the manner of counting amplitude levels. The counting operation in HIDM is in binary steps, and proceeds exponentially for the duration of a sequence of pulses of one polarity. When an overcorrection occurs, pulse polarity reverses and the count direction reverses. When a reversal is required and when the count increment has been large, the sequence does not return to unit count.

In redundancy reduction systems such as disclosed in U.S. Pat. No. 3,383,461, an elaborate process is followed to approximate the input signal waveform by matching polynomials to the input waveform. Redundancy reduction performs extremely well on transient data, but contributes controlled error to the low frequency components, and has not been widely accepted due to data degradation, sensitivity to bit errors and equipment complexity.

OBJECTS OF THE PRESENT INVENTION

It is therefore an object of the present invention to provide a novel data handling system providing for the conversion of analog data into digital form for convenience in handling and the subsequent reconstruction of a facsimile of the original analog signal.

Another object of the present invention is to provide a novel data handling system wherein analog data is converted into digital signals which may be stored using conventional data storage techniques and then reconverted on playback to generate a facsimile of the original analog signal.

Still another object of the present invention is to provide a novel data handling system for efficiency converting analog data into digital form suitable for transmission to a remote location at which the digital data may be converted back into the original analog form.

Still another object of the present invention is to provide a novel data handling system for a data transmission system which is highly efficient, yet simplified in structure and function.

Still another object of the present invention is to provide a novel data handling system which utilizes the functional equivalent of an adaptive inverse filter as a means for enabling the conversion of analog data into a particular digital code which can subsequently be reconverted back into analog form through the use of an adaptive RC filter means.

Still another object of the present invention is to provide a data handling system having improved edge response characteristics without accompanying increases in quantization noise.

Still another object of the present invention is to provide a data handling system having minimum vulnerability to transmission errors due to the utilization of an RC decoder network wherein past errors diminish asymptotically with time.

SUMMARY OF THE PRESENT INVENTION

In accordance with a preferred embodiment of the SAED system of the present invention, corresponding encoder and decoder units are provided for use in data storage and transmission applications. The encoder unit includes a signal comparator, an adaptive function generator and a binary pulse generator. The analog data to be transmitted is coupled into one input of the comparator while the output of the comparator is fed into the pulse generator for conversion into pulses for storage or transmission to a remote receiver. The adaptive function generator is responsive to the output of the pulse generator and serves to generate a complex waveform having particular characteristics dependent upon the correlation between the input analog signal and the generated complex waveform. This waveform is applied to the other input of the comparator for comparison with the analog input signal.

In a preferred embodiment the adaptive function generator includes a dual polarity voltage source and a selectable voltage divider network coupled thereto and controlled by a logic network responsive to the output of the pulse generator in a manner so as to generate an asymptotic S function, the characteristics of which are determined by the correlation between the complex waveform and the input analog data.

The decoder portion of the preferred embodiment includes a dual polarity voltage supply coupled through an adaptive RC filter that is controlled by a logic network responsive to the input binary data in a manner such that an output signal is generated which closely approximates the original analog signal.

The SAED system of the present invention is only slightly more complicated than the typical delta modulation (DM) system, contributes less error than pulse code modulation (PCM) systems, and is capable of recovering immediately from transmission bit errors. Other advantages of the present invention will become apparent to those skilled in the art after a reading of the following detailed description of the preferred embodiments which are illustrated in the several figures of the drawings.

IN THE DRAWING

FIG. 1 is a block diagram illustrating a theoretical data handling system providing the basis for the present invention.

FIG. 2 is a block diagram of a data handling system in accordance with the present invention.

FIG. 3 is a simplified schematic diagram of the encoder portion of a data handling system in accordance with the present invention.

FIGS. 4 and 5, respectively, illustrate families of asymptotic S curves of the type generated by the adaptive function generator of the present invention.

FIG. 6 is a schematic diagram of the decoder portion of a data handling system in accordance with the present invention.

Figure 7:
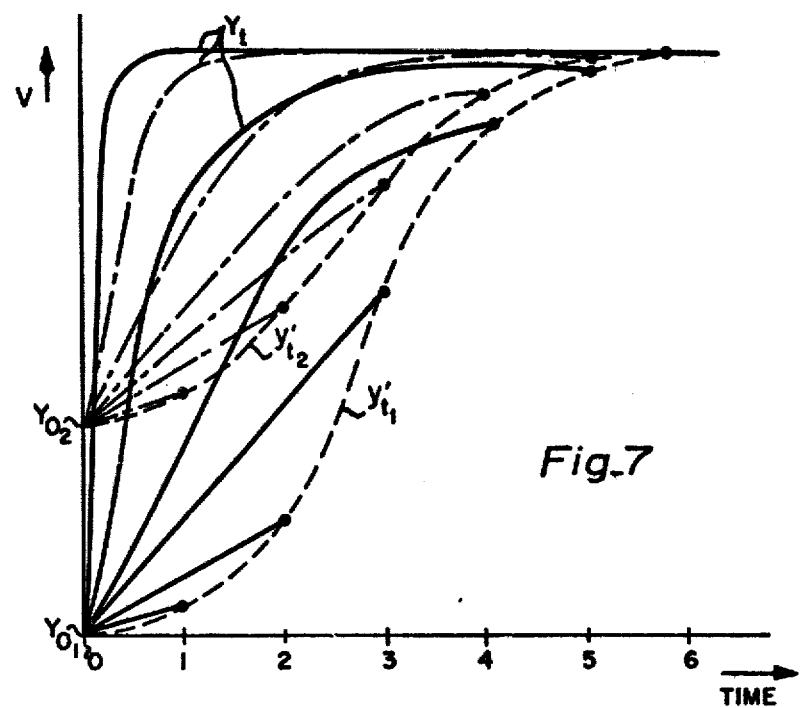
Figure 8:
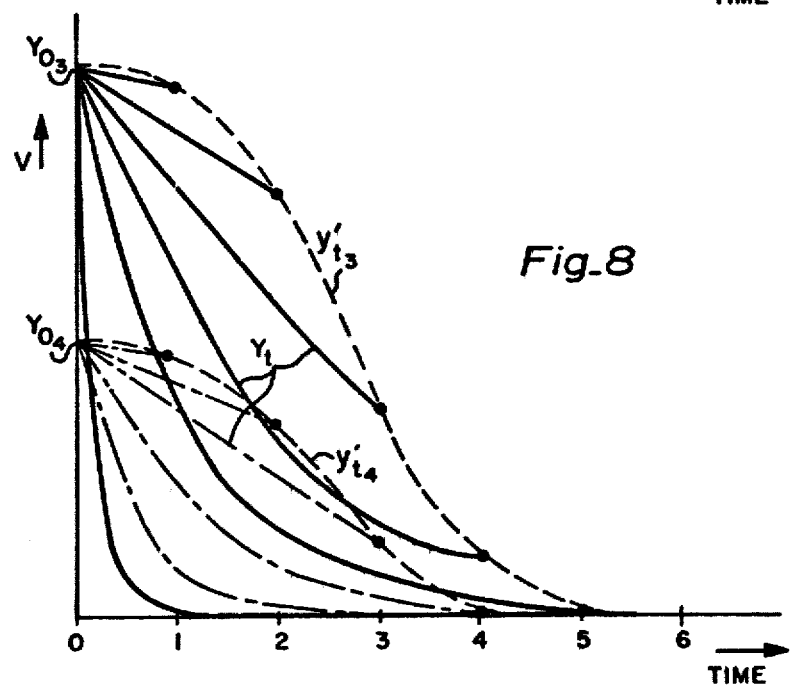

FIGS. 7 and 8, respectively, illustrate families of curves generated by the adaptive filter apparatus of the decoder portion of a data handling system in accordance with the present invention.

FIG. 9, consisting of A-F, is a timing diagram illustrating in detail the operation of a data handling system in accordance with the present invention.

FIG. 10 is a block diagram of a video recording system incorporating the encoder portion of the present invention.

FIG. 11 is a block diagram of a video playback system incorporating the decoder portion of the present invention.

DETAILED DESCRIPTION OF THE PREFERRED EMBODIMENTS

Referring now to FIG. 1 of the drawing, the sequential approximation encoding and decoding (SAED) concept of the present invention is shown in block diagram form to include an encoder 10 comprised of an adaptive inverse filter means 11 and a threshold sensor 12, and a decoder 13 having a complementary adaptive RC filter means 14. From a conceptual standpoint, the technique involved in the present invention utilizes an adaptive inverse filter which partially differentiates and thresholds an input analog signal and generates in response thereto a binary bit stream which may be recorded or transmitted and subsequently fed to the decoder wherein the adaptive RC filter reconstitutes the original analog signal.

A sampled RC filter without loss can be expressed by the following equation:

$$\bar{y}_t = a y_t + b \bar{y}_{t-1} \tag{1}$$

where "a" and "b" are variable coefficients and are related so that $$a + b = 1 \tag{2}$$

Conversely, an expression of an inverse or complementary relationship to equation (1) can be represented by $$y_t = \bar{y}_t + (1/a - 1)\Delta \bar{y}_t \tag{3}$$

where $\bar{y}_t$ is the filtered value of the sampled $y_t$ analog function, and $\Delta \bar{y}_t = \bar{y}_t - \bar{y}_{t-1}$ is the simple difference between consecutive filtered samples.

The unique property of the sampled RC filter and its associated inverse filter is that any signal passed through the RC filter can be completely recovered in amplitude and phase by passing the filtered signal through the inverse filter. Similarly, the process is reversible so that if an arbitrary analog function is first passed through the inverse filter and the ensuing differential output is then passed through the complementary RC filter, the original analog signal will be completely restored.

The cutoff frequency of the RC filter represented by equation (1) can be changed by varying the coefficient "a". For example, if $a=1$, then by equation (2), $b=0$ and the filter will have a theoretical infinite frequency response. Similarly, if $a=0$, then $b=1$ and the filter cutoff frequency will drop to zero. Cutoff frequencies varying from zero to infinity are therefore possible by changing the coefficient "a" from 0 to 1. The amount of first derivative (first difference) produced by an inverse filter operational according to equation (3) likewise is determined by the value of the coefficient "a".

To achieve a reduction in signal bandwidth, it is desired to convert the differentiated output of the adaptive inverse filter 11 into a binary signal. However, by thresholding the inverse filter output to produce a binary rather than an analog output, the unique relationship between the inverse filter and the complementary filter is destroyed. It is therefore necessary that this relationship be restored by continuously modifying the "a" coefficient in such a manner that the errors caused by the thresholding process are substantially reduced. This can be achieved by relating "a" to the binary $B_t$ output generated by the thresholder 12. Although hardware required to provide such an adaptive inverse filter is quite complicated, the equivalent function of the inverse filter can be obtained within the encoder 10 and can be implemented utilizing a feedback circuit which will be described below. Note however, that if the thresholding circuit 12 were to be eliminated, the feedback solution would be identical in performance to the true inverse filter concept. In addition, due to the nonlinearities introduced by the thresholder 12, it is necessary to utilize a modified adaptive filter solution in the inverse filter feedback loop so that the adpative RC filter in the decoder 13 will produce the desired analog function at the system output 15. These considerations will be discussed in more detail below.

Referring now to FIG. 2, a simplified block diagram of a preferred embodiment of a data transformation system is illustrated and includes an encoder 16 forming a part of a transmitter and a decoder 17 forming a part of a receiver which are operatively coupled together by a suitable communication system (data link) capable of transmitting data in digital form.

An analog input applied to the encoder 16 from a signal source is coupled into the system at the input terminal 18 which is also one of the inputs to a comparator 20. Comparator 20 in the preferred embodiment is a difference amplifier having the two input terminals 18 and 22 and develops an output commensurate with the relationship between the two input signals $y_t$ and $y'_t$. The output of comparator 20 is fed into a threshold detector 24 which compares the comparator output signal to a ground or zero reference and generates an output signal which is either of two states depending upon whether the output signal is positive or negative, i.e., if the difference between the signals input to comparator 20 is more positive than the threshold, then the output of detector 24 will be of one state, whereas if the output of comparator 20 is more negative than the threshold, then the output of detector 24 will be of a second state. The output of detector 24 is constrained to change states at certain predetermined times as determined by a clock 26 so that the digital output $B_t$ (encoded signal) at terminal 28 will, in accordance with the preferred embodiment, be equivalent to a series of logical binary "1"'s and "0"'s which are respectively of even amplitude and duration.

In order to generate a reference signal for application to the other input 22 of comparator 20, the binary encoded signal $B_t$ provided at terminal 28 is fed into an adaptive function generator 30 which generates a predetermined type of non-linear, time varying waveform, the specific characteristics of which depend upon the transitional characteristics of the analog signal input at terminal 18. The output of generator 30 is then fed directly into comparator 20 at input 22. Since the output of comparator 20 is determined by the difference between the input signals applied thereto, and the detector 24 is responsive to the magnitude of such output, the signals generated at terminal 28 will, although different in form, correspond to the analog input at terminal 18. This being the case, it will be apparent that the degree of correlation between input and output signals of transmitter 16 will be determined by the capability of function generator 30 to match the analog signal input at 18. A preferred embodiment of the function generator 30 will be disclosed in detail below.

Once the input analog data has been converted into binary form, it can be transmitted to a remote receiver including the decoder 17 using any of the various known data communication systems. Decoder 17 includes a binary-to-analog converter comprised primarily of an adaptive filter 32 which is capable of generating a facsimile of the original analog signal upon receipt of the binary data developed by encoder 16. It is important to point out, however, that the adaptive filter 32 is of a particular type which is complementary to the simulated inverse filter in the encoder 16 and thus has the capability of closely approximating the original analog signal in response to the received binary information.

If an input signal in the form $y_t$ is applied to input terminal 18, assuming no input is applied to 22, an output signal will be generated by comparator 20 which will be compared to a predetermined threshold value by detector 24 and an output pulse in the form of a binary "1" or "0" will be generated corresponding to the detected threshold relationship. The duration of this binary pulse is determined by the clock 24. In order that the output of detector 24 be caused to correspond to the input signal at terminal 18, the binary signal appearing at output terminal 28 is applied to the function generator 30 which generates in response thereto a particular type of signal which is either an asymptotic increasing function or an asymptotic decreasing function depending upon whether the signal is a binary "0" or a binary "1".

The output function of generator 30 is designated $y'_t$ and is applied to the input terminal 22 of comparator 20 for comparison with the analog input signal $y_t$. As long as the instantaneous value of $y_t$ exceeds that of $y'_t$, the output of comparator 20 will be positive and detector 24 will cause encoded signals of a single state, for example, a series of "1" bits, to be generated at terminal 28. When applied to the input of generator 30, each successive "1"

appearing in the transmitter output signal causes a change in the nature of the function $y'_t$ produced by generator 30 until the value $y'_t$ "crosses over" the value of $y_t$ as indicated by a change in sign in the output of comparator 24 and accordingly, a change in the state of the output of detector 24 from a "1" or "0".

Upon the occurrence of a "0" at terminal 28 following one or more "1" bits, generator 30 causes $y_t$ to decrease in a predetermined manner which is determined initially by the preceding value of $y'_t$ and subsequently by the number of "0" bits which occur in succession before $y'_t$ again crosses over $y_t$. Thus, the output $B_t$ at terminal 28 will at all times correspond in a particular binary form to the analog input at terminal 18 and it is this binary signal which is transmitted to the decoder 17 using suitable communication apparatus. It should perhaps be pointed out at this point that the communication apparatus may include magnetic recording or other data storage media which will permit the transmitted data to be delayed for any desired period of time.

Decoder 17, upon receiving the transmitted signals in the form of a train of unsegregated pulses, causes the adaptive filter means 32 to respond in accordance with the number of "1" bits and "0" bits appearing in succession in the transmitted data so as to generate an output signal $Y_t$ at terminal 34 which is an approximation of the original analog input $y_t$.

Turning now to FIG. 3 of the drawing, the operative characteristics of a simplified embodiment of the encoder 16 are illustrated in more detail with particular emphasis being given to the operation of the function generator 30 which is shown enclosed within the dashed lines. Function generator 30 includes a logic network 40 responsive to the binary signal appearing on line 28 and is operative to cause a shift register 42 to be advanced one step for each clock period until the output on line 26 changes state. The output of shift register 42 is used to selectively close one of a plurality of gates 44 which couple current from a power supply 52 through a resistive voltage divider network 46 and an amplifier 48 to input 22 of the comparator 20. The individual values of the respective resistors R are chosen so as to determine the incremental values of $y'_t$. As will be discussed more fully below, the values of the resistors R in the preferred embodiment are chosen such that the locus of voltages obtained in stepping across the terminals of the divider describe an S-curve of the type illustrated in FIGS. 4 and 5 which is asymptotic to some predetermined potential.

One end of the divider network 46 is selectively connectable by way of a switch 50 to either of two terminals of a power supply means 52, one of which supplies a negative potential and the other of which supplies a positive potential. Switch 50 is switched between the positive and negative terminals of power supply 52 by a switch driver 60 in response to each change in state of the binary data train detected by the logic network 40. The other end 54 of the divider network 46 is coupled to the output of amplifier 48 by means of a pair of cascaded sample-and-hold circuits 56 and 58 which include switches $S_1$ and $S_2$, capacitors $C_1$ and $C_2$ and buffer amplifiers $A_1$ and $A_2$ respectively. Switch $S_1$ is normally closed and switch $S_2$ is normally open. The function of these circuits is to cause the voltage at point 54 to be set at the voltage appearing at the output of amplifier 48 each time the binary output at 28 changes state and switch 50 is switched from one of the terminals of power supply 52 to the other.

For example, assuming that switch 50 is in the positive position and gate 1 is closed as indicated, then the reference signal input to terminal 22 through amplifier 48 will be of a particular value. Since switch $S_1$ is normally closed and switch $S_2$ is normally open, capacitor $C_1$ will be charged to the voltage appearing at the output of amplifier 48 and during the present clock period $y'_t$ will have a value determined by the voltage drop across resistor $R_1$. Should the next pulse in the data train $B_t$ be of the same state then gate 1 will be opened and gate 2 will be closed so that $y'_t$ is determined by the drop across resistors $R_1$ and $R_2$, and so forth. However, if the output of comparator 20 changes polarity causing threshold detector 24 to change state, the switch driver 60 will cause switch $S_1$ to open momentarily and switch $S_2$ to close momentarily so as to transfer the potential from capacitor $C_1$ to capacitor $C_2$ thereby causing the potential $y'_0$ at point 54 to be made equal to that value of $y'_t$ which previously appeared at terminal 22.

Switch driver 60 at the same time also causes switch 50 to contact the negative terminal of power supply 52 so that now the drop across the divider network 46 is in the opposite direction to that which it previously was. Thus, the drop across the network is now determined by the difference between the present potential at terminal 54 and the negative value of power supply 52. The manner in which the reference signal $y'_t$ changes between each signal crossover will therefore depend not only upon the number of clock periods between each change in state of the binary data generated at terminal 28, but also upon the value of $y'_t$ at the time of the crossover. In other words, the particular form of $y'_t$ over any particular transitional interval, i.e., the period between signal crossovers, will be directly related to the value of $y'_t$, i.e. $y'_0$, at the beginning of each new interval. Although the above mentioned switches are illustrated as mechanical devices, it is to be understood that suitable electronic switching means would generally be substituted therefor.

In accordance with the schematically illustrated preferred embodiment of the invention, the logic network 40 causes the shift register 42 to be reset at each change in state of the output at terminal 28 so as to return to the beginning of the stepping sequence, i.e., to close only gate 1, upon each actuation of switch driver 60. However, in accordance with an alternative embodiment, instead of resetting shift register 42 at each crossover the logic network 40 is adapted to merely cause shift register 42 to shift down one step for each clock period until the next crossover. The choice of which type of operation to be utilized will, of course, involve certain tradeoffs primarily determined by the expected transitional characteristics of the analog input data $y_t$.

Turning now to FIG. 4 of the drawing, the nature of the voltage appearing at terminal 18 for a six-stage system, i.e., one having six gates 44, is diagrammatically illustrated as an S-curve defining the locus of the coordinate points designated $y'_0, y'_1, y'_2, y'_3, \ldots y'_6$ as indicated in the drawing. These curves illustrate various values of $y'_t$ when sampled at the beginning of each clock period. The particular form of each S-curve is, of course, determined by each new value of $y'_0$, which is the voltage transferred to point 54 at the first clock period following each signal crossover. The subscripts 1 through 6 correspond to the number of gates $1, 2 \ldots n$ and also to successive clock periods following each change of state in the data at terminal 28. The voltage $V_p$ to which each of the curves is asymptotic is determined by the voltage available at the positive terminal of power supply 52 less the drop across resistor $R_n$.

In FIG. 5, a family of S-curves for decreasing values of $y'_t$ is illustrated. The values of $y'_t$ will follow these types of curves when switch 50 is connected to the negative terminal of power supply 52 and $y'_0$ is more positive than the negative potential. The characteristics of these curves, although decreasing in nature, are similar to those of the positive going curves of FIG. 3. These curves, however, are asymptotic to the voltage available at the negative terminal of power supply 52 less the drop across resistor $R_n$. It is to be clearly understood the S-curve type of response illustrated in FIGS. 4 and 5 is only one of several possible functions which may be used in accordance with the invention, and any other suitable response configuration can be produced by merely selecting appropriate values for the resistors R of the voltage divider 46.

Referring now to FIG. 6 of the drawing, a simplified embodiment of the adaptive filter used to convert the data transmitted to the receiver 17 in the binary form $B_t$ back into the reconstructed analog form $Y_t$ is illustrated. The adaptive filter 32 includes a shift register 70 having a plurality of outputs coupled to a decoder 72 which drives the gates a, b, c ... n. The gates a, b, c, ... n form the operative portions of the adaptive RC filter network 74 which includes the resistors $R_a$, $R_b$ ... $R_n$ and a capacitor 76. A gate bus 75 couples one terminal of each gate to the power supply 78 through the switch 80. Switch 80 enables bus 75 to be selectively connected to either the positive terminal 82 or the negative terminal 84 in response to signals received from position 1 of the shift register 70 via lines 86 and 88. Switch 80 will be positioned to connect the positive supply voltage line 82 to the gate bus 75 if position 1 of the shift register 70 is a binary 1, but if a binary zero occupies position 1, then the negative supply line 84 will be coupled to gate bus 75.

As the binary data $B_t$ is shifted through the register 70 and data of differing states fill position 0 and 1, respectively, the NOR gate 90 will generate a triggering signal which causes decoder 72 to close the gate which corresponds to the last data bit of the same type and series beginning with the bit in position 1. In other words, whenever the 0 and 1 positions within shift register 70 are unlike (of opposite state), NOR gate 90 will become true and actuate the decoder 72. Therefore if any single gate of network 74 is closed, it will remain closed until positions 0 and 1 in shift register become different. At this time, the decoder 72 is again actuated, a new gate within network 74 is closed and the switch 80 is changed to its other position.

At the time positions 0 and 1 in the shift register 70 become different, the decoder 72 examines positions 1 through n to determine the number of consecutive stages which have the same state as position 1. For example, if positions 1 and 2 contain logical 1's and position 3 contains a logical 0, then gate "b" will be closed for two bit intervals (until positions 0 and 1 again become different) as the input bits are shifted through the shift register 70. As another example, if positions 0 and 1 are different and positions 1, 2 and 3 contain logical 0's and position 4 is a logical 1, then gate "c" will be closed for the next 3 bit periods. The output signal $Y_t$ generated at terminal 96 is thus determined by the position of switch 80 and the RC time constant of the circuit comprised of one of the resistors R and the capacitor 76.

Referring now additionally to FIGS. 7 and 8, examples of the forms taken by the output $Y_t$ in response to the transmitted binary signals $B_t$ are illustrated. Note that the form and slope of $Y_t$ is determined not only by the pretransition value $Y_0$, but also by the point along the curve $y'_t$ at which the next transition occurs, i.e., the number of clock periods which occur between each signal crossover. It should be kept in mind that even though there appears to be a rather large discrepancy between the wave shapes of the functions $Y_t$ and $y'_t$, the original analog input signal $y_t$ fell somewhere inbetween the two with the probability being that $y_t$ is more closely related to $Y_t$ than to $y'_t$ because of the manner in which $y'_t$ was originally generated. Thus, as will be shown below the accuracy of the reproduction can be expected to be quite high.

Turning now to FIG. 9 of the drawing, the operation of the overall system will be discussed by way of a generalized example. In FIG. 9A the clock pulses generated by clock 26 are shown to provide reference for the curves illustrated therebeneath. In FIG. 9B an arbitrary analog signal of the type which might be applied to input terminal 18 is illustrated by the continuous curve $y_t$. This signal although shown stretched in time could be a portion of a portion of a television signal, radar video signal or scanned photographic data signal. The function $y'_t$ produced by the function generator 30 is superimposed over the analog signal for purposes of comparison and the initial, or $y'_0$, value of $y'_t$ is assumed to be initially less than $y_t$ so that the initial difference signal $(y_t - y'_t)$ generated by comparator 20 will be positive, as indicated by the curve 101 in FIG. 9C.

Assuming that $y'_0$ is initially at about midrange between the positive and negative voltages of power supply 52, the generator 30 will produce a $y'_t$, such as that shown at 100 in FIG. 9B, which is a portion of an increasing S-curve of the type illustrated in FIG. 4, and eventually intersects $y_t$ at point 102. During the time that $(y_t - y'_t)$ is positive $B_t$ will be in the form of logical 1's as indicated at 103 in FIG. 9D. However, after $y_t$ and $y'_t$ intersect at point 102 the difference between $y_t$ and $y'_t$ becomes negative and threshold detector 24 will upon the occurrence of the next clock pulse $c_3$, cause the output $B_t$ to change states from "1" to "0" as indicated at 104 in FIG. 9D.

At this point, a decreasing function of the type illustrated in FIG. 5 of the drawing, will be generated by generator 28 which intersects $y_t$ at point 106 (FIG. 9B). But, as before, the detector 20 is prohibited from changing states until the next occurring clock pulse $c_4$. However, at the occurrence of pulse $c_4$, $B_t$ is allowed to change state and generate a "1", as indicated at 108 in FIG. 9D, causing $y'_t$ to become an increasing function, as shown at 110 (FIG. 9B), which crosses $y_t$ at point 112. Upon the occurrence of the following clock pulse $c_7$, $y'_t$ again becomes decreasing as indicated at 114 and continues to decrease until it again crosses $y_t$ at point 116. Note that since the value of $y'_0$ at point 113 is large and since nearly four clock periods pass before $y'_t$ again intersects $y_t$, generator 30 produces a $y'_t$ having a very steep negative slope characteristic.

Upon the occurrence of the following clock pulse $c_{11}$, the output of detector 20 again changes state as shown at 118 (FIG. 9D) causing $y'_t$ to start increasing in the positive direction whereafter it subsequently intersects $y_t$ at 120, etc. Thus, as indicated in FIG. 9D, the illustrated analog function $y_t$ between clock periods $C_0$ and $C_{12}$ can be represented in the binary language $B_t$ at 111011100001 . . . , and this is the form of indicia which is either transmitted or recorded.

As the series of pulses comprising $B_t$ is received by the receiver 17, the adaptive filter 32 is caused to generate an output $Y_t$ of the type illustrated in FIGS. 9E and 9F. In FIG. 9E, $Y_t$ is compared to $y'_t$ the function generated by generator 30, whereas in FIG. 9F, $Y_t$ is compared to the original analog input signal $y_t$ to illustrate how closely the present invention is capable of reconstructing the analog signal after transmission. More specifically, when the adaptive filter 32 receives the transmitted binary data $B_t$, the first three binary ones $B_1$, $B_2$ and $B_3$ will be shifted through the shift register 70 until $B_3$ is contained in the zero position of register 70, and $B_4$ is contained in the position one. Since $B_3$ and $B_4$ are of different states, switch 80 will change from positive terminal 82 to negative terminal 84, and the NOR gate 90 will cause decoder 72 to close switch "a" which corresponds to the register position of the last logical bit of the same state of the series containing $B_4$. Note that gate "c" was initially closed at time $c_0$ for three bit periods enabling current from the power supply 78 to flow through $R_c$ into capacitance 76 to generate a signal $Y_t$ at output terminal 96 of the form 122 shown in FIG. 9E. Similarly, during the time gate "a" is closed current will flow through resistor $R_a$ to generate the $Y_t$ 124.

As $B_5$ is shifted in to occupy the zero position of register 70 and $B_6$ occupies position one, switch 80 will again be moved to the positive terminal 82, and NOR gate 90 will cause the decoder 72 to close gate "a", interrogate itself and then open gate "c" allowing current from the positive terminal of power supply 78 to flow through the resistance $R_c$ into capacitor 76 to generate the signal 126 illustrated in FIG. 9E. Likewise, the next four bits $B_8$–$B_{11}$ will pass through the register until $B_7$ is in the zero position and $B_8$ is in the one position. This will again cause switch 80 to be switched to the negative terminal, and the decoder will cause gate "c" to be opened and gate "d" to be closed for four bit periods generating the output signal 128 at output terminal 96. This actuation will continue as long as the input data is supplied to the adaptive filter 32.

Note in FIG. 9F that because of the adaptive character of the filter 32, the slope of the function $Y_t$ as well as the asymptotic character thereof is adapted to very closely follow the original analog input signal $y_t$. Even where $y_t$ makes an abrupt transition, such as that at 130 (FIG. 9F), $Y_t$ is able to closely follow $y_t$ as indicated at 128.

In FIGS. 10 and 11 of the drawing, block diagrams of a video record and playback system incorporating the present invention are shown respectively. In FIG. 10, the output of a commercial or studio type TV camera 200 is fed directly into the SAED encoder 202 with the clock of the encoder 202 being synchronized to the frequency standard used for the TV camera 200. The SAED encoder 202 converts the analog video from camera 200 into a binary or other digital form which can be recorded on a fairly loosely coupled tape recorder 204. The recorder could be a helical scan, quadraphase scan, or even a parallel multitrack type recorder. Actually, any type of recorder capable of handling the binary data generated by the encoder 202 may be used.

Turning now to FIG. 11, the playback system includes a tape playback unit 206 which need not necessarily be the same machine used to record the data, and the output thereof is fed through a bit synchronizer 208 to a digital buffer 210, and then into the SAED decoder 212 which may, in a simplified form, be embodied much along the lines of that illustrated in FIG. 6. A buffer status monitor 216 is also provided for monitoring the fullness of the buffer 210 and controlling the tape recorder accordingly. This is, in effect, a low speed servo that causes the tape recorder to speed up or slow down depending upon whether the buffer is running full or going empty. On playback, the system is capable of compensating for problems such as flutter and wow which occur as a result of the playback operation. Any standard state of the art solution can be utilized to provide bit synchronization, and one embodiment might, for example, take the form of a Manchester code or some other code for simplifying the operation. After the clock is established and the data is derived from the synchronizer 208, it is fed into the digital buffer 210 which is used to compensate for the time-base instability that the flutter and wow components of the tape recorder have introduced into the signal. The output of the buffer is then clocked into the SAED decoder 212 using a clock which is derived from a local frequency standard 214.

The present invention offers the advantage that instead of requiring the very complex time-base stability correction equipment presently utilized in tape recording systems a greatly simplified buffer synchronized system may be used. This means that tapes made on one machine can be played back on any other suitable machine and can even be duplicated since the system electronically corrects the time-base. Furthermore, the present invention makes it possible to economically transmit video rate data over long distance wire communication systems. Although the above discussion of the utility of the present invention in a television recording system is brief, it will be understood that the SAED apparatus can be utilized in many different types of systems in order to provide the numerous advantages pointed out above as this is but one of such systems.

In accordance with the invention, a data conversion system is provided which is relatively simple in construction and which is capable of following with a high degree of correlation any input analog signal without experiencing serious degradation upon the occurrence of large signal transitions. The system can be adapted to convert the analog input signal into other forms than the illustrated binary form for transmission and recording and certain data compression techniques be incorporated into the storage or transmission system. Moreover, the physical make-up of the inverse filter and the adaptive RC filter disclosed above may be modified to better accommodate analog signals having certain types of characteristics.

The present invention has the additional advantages of providing good edge response and being highly insensitive to transmission errors. Furthermore, the system can use continuous rather than discrete switching or adaptive filtering and may be modified to include previous line interpolation or other signal anticipatory features so as to provide any desired degree of reproduction accuracy.

As used in the claims, the term "encoding and decoding system" is intended to mean any system for modifying analog data to facilitate its subsequent reproduction, and the terms "data link means" and "data linking means" are deemed to include any form of data conveyance means whether it be direct communicative media or involve some means of data storage. For example, such means may be as complex as to include an interplanatory communication system or be as simple as to include an ordinary magnetic storage device encoded signal. The claims are in no way intended to be limited to apparatus for communicating between remote locations. It is therefore to be understood that this description of the preferred embodiments of the present invention is for purposes of illustration only and is in no way intended to be limiting. Accordingly, it is intended that the appended claims be interpreted as covering all modifications which fall within the true spirit and scope of the invention.

What is claimed is:

1. In an encoding and decoding system including, an analog-to-digital encoding means for developing an encoded signal in response to an input signal in which each word has one digit, such encoded signal containing data components determinative of sequential inflection points in said encoded signal, a digital-to-analog decoding means for developing an output signal in response to said encoded signal, and a data linking means for transferring said encoded signal from said encoding means to said decoding means, an improved decoding means comprising:

decoder logic means including a serial shift register responsive to said encoded signal and having a plurality of binary stages, said logic means providing a first and a second control signal, said first control signal being responsive to the logic state of a selected stage of said register and said second control signal being responsive to the logic state of a pair of selected immediately adjacent stages of said register;

potential source means responsive to said first control signal and operative to provide a reference potential which is either negative or positive depending on the condition of said first control signal; and adaptive RC filter means responsive to said reference potential and said second control signal and operative to develop said output signal, said adaptive RC filter means including, capacitor means on which said output signal is developed, a plurality of resistors connected to said capacitor means, and switch means responsive to said second control signal and the condition of said shift register and operative to selectively connect only one of said resistors to said source means whereby said capacitor means is charged to a potential which at any given time is an approximation of said input signal.

2. In an encoding and decoding system in accordance with claim 1 in which said register has $(n+1)$ stages and said plurality of resistors has n resistors, and in which said first control signal is responsive to the state of the nth stage of said register and the second control signal is responsive to the state of the nth and $(n+1)$th stage of said register.

3. In an encoding and decoding system in accordance with claim 2 in which each resistor is associated with one of the first n stages of said register, and in which said second control signal changes its state only when the state of the nth and $(n+1)$th stages changes from being the same to being different or from being different to being the same.

4. In an encoding and decoding system in accordance with claim 3 in which said switching means is activated only when said second control signal changes its state, and in which said switching means reverse scans the stages of said register when activated, starting at the nth stage, and determine the first stage of the consecutive group of stages having the same state as the nth stage.

5. In an encoding and decoding system in accordance with claim 4 in which said switching means connects the resistor corresponding to said first stage of said consecutive groups to said source means.

* * * * *